United States Patent
Jeong et al.

(10) Patent No.: US 9,275,968 B2
(45) Date of Patent: Mar. 1, 2016

(54) FLIP CHIP PACKAGES HAVING CHIP FIXING STRUCTURES, ELECTRONIC SYSTEMS INCLUDING THE SAME, AND MEMORY CARDS INCLUDING THE SAME

(71) Applicant: SK hynix Inc., Icheon (KR)

(72) Inventors: Jung Tae Jeong, Icheon (KR); Si Eon Kim, Andong (KR); Jong Woo Ahn, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/516,223

(22) Filed: Oct. 16, 2014

(65) Prior Publication Data
US 2015/0348930 A1    Dec. 3, 2015

(30) Foreign Application Priority Data
May 27, 2014    (KR) .......................... 10-2014-0063832

(51) Int. Cl.
*H01L 23/00*    (2006.01)

(52) U.S. Cl.
CPC ......... *H01L 24/17* (2013.01); *H01L 2224/1703* (2013.01)

(58) Field of Classification Search
CPC ........................ H01L 24/17; H01L 2224/1703
See application file for complete search history.

(56) References Cited

U.S. PATENT DOCUMENTS

| | | |
|---|---|---|
| 5,400,950 A | 3/1995 | Myers et al. |
| 2006/0163749 A1 | 7/2006 | Lee et al. |
| 2012/0187583 A1 | 7/2012 | Karpur et al. |
| 2014/0131886 A1* | 5/2014 | Paek ...................... H01L 24/11 257/774 |

* cited by examiner

*Primary Examiner* — Roy Potter
*Assistant Examiner* — Paul Patton

(57) ABSTRACT

A flip chip package includes a chip having a surface, main bumps disposed on a first region of the surface of the chip, dummy bumps disposed on a second region of the surface of the chip, a substrate having a surface, dams disposed on the surface of the substrate, connection pads disposed on the surface of the substrate and electrically connected to respective ones of the main bumps, and adhesion patterns attaching the dummy bumps to respective ones of the dams.

17 Claims, 11 Drawing Sheets

FLIP CHIP PACKAGES HAVING CHIP FIXING STRUCTURES, ELECTRONIC SYSTEMS INCLUDING THE SAME, AND MEMORY CARDS INCLUDING THE SAME

CROSS-REFERENCE TO RELATED APPLICATION

The present application claims priority under 35 U.S.C 119(a) to Korean Application No. 10-2014-0063832, filed on May 27, 2014, in the Korean intellectual property Office, which is incorporated herein by reference in its entirety.

BACKGROUND

1. Technical Field

Various embodiments of the present disclosure relate to semiconductor packages and, more particularly, to flip chip packages, electronic systems including the same, and memory cards including the same.

2. Related Art

Advanced materials, advanced devices, advanced modules and advanced substrates, which are capable of processing data at a high speed in a high frequency bandwidth, are increasingly desirable with development of information/communication technology and digital technology. Particularly, in a mobile telecommunication area, because mobile telecommunication systems become smaller with a multi-band characteristic and a high operation speed, semiconductor chips employed in the mobile telecommunication systems become more highly integrated. Accordingly, various packaging technologies have been developed to produce lighter, smaller, and thinner semiconductor packages. Recently, development of the packaging technologies has been concentrated on chip size packages (CSPs) and wafer level packages (WLPs).

In general, packages are fabricated by electrically connecting a chip to a package substrate through bonding wires and by encapsulating the chip and the bonding wires using a molding process. Recently, however, a flip chip is mounted on a package substrate and is electrically connected to the package substrate through bumps disposed between the flip chip and the package substrate to realize a flip chip package. In such a flip chip package, lengths of electrical connection paths between the chip and the package substrate may be reduced to improve electrical characteristics of the flip chip package. Moreover, the number of input/output (I/O) pins of the flip chip package may be increased for a given area to realize a high performance package.

SUMMARY

Various embodiments are directed to flip chip packages, electronic systems including the flip packages, and memory cards including the flip chip packages.

According to some embodiments, a flip chip package includes a chip, main bumps disposed on a first region of a surface of the chip, dummy bumps disposed on a second region of the surface of the chip, a substrate, dams disposed on a surface of the substrate, connection pads disposed on the surface of the substrate and electrically connected to respective ones of the main bumps, and adhesion patterns attaching the dummy bumps to respective ones of the dams.

According to further embodiments, a flip chip package includes a chip having a first surface on which main bumps are disposed and a second surface opposite to the first surface, a substrate having a surface on which connection pads connected to the main bumps are disposed, and fixing structures attached to the surface of the substrate along edges of a chip attachment region of the substrate.

According to further embodiments, a flip chip package includes a chip having a first surface on which main bumps are disposed and a second surface opposite to the first surface, a substrate having a surface on which connection pads are disposed, the connection pads being connected to the main bumps, dams disposed on the surface of the substrate and having top surfaces which are substantially coplanar with the second surface of chip, and an adhesive layer attached to outer sidewalls of the dams, the top surfaces of the dams, and the second surface of the chip.

According to further embodiments, an electronic system includes a memory and a controller coupled to the memory via a bus. The memory or the controller includes a chip having a surface, main bumps disposed on a first region of the a surface of the chip, dummy bumps disposed on a second region of the surface of the chip, a substrate having a surface, dams protruding from the surface of the substrate, connection pads disposed on the surface of the substrate and electrically connected to respective ones of the main bumps, and adhesion means patterns attaching the dummy bumps to respective ones of the dams.

According to further embodiments, an electronic system includes a memory and a controller coupled to the memory via a bus. The memory or the controller includes a chip having a first surface on which main bumps are disposed and a second surface opposite to the first surface, a substrate having a surface on which connection pads connected to the main bumps are disposed, and fixing structures attached to the surface of the substrate along edges of a chip attachment region of the substrate.

According to further embodiments, an electronic system includes a memory and a controller coupled to the memory via a bus. The memory or the controller includes a chip having a first surface on which main bumps are disposed and a second surface opposite to the first surface, a substrate having a surface on which connection pads are disposed, the connection pads being connected to the main bumps, dams disposed on the surface of the substrate and having top surfaces which are substantially coplanar with the second surface of chip, and an adhesive layer attached to outer sidewalls of the dams, the top surfaces of the dams, and the second surface of the chip.

According to further embodiments, a memory card includes a memory and a memory controller that controls operations of the memory. The memory or the memory controller includes a chip having a surface, main bumps disposed on a first region of the a surface of the chip, Dummy bumps disposed on a second region of the surface of the chip, a substrate having a surface, dams protruding from the surface of the substrate, connection pads disposed on the surface of the substrate and electrically connected to respective ones of the main bumps, and adhesion means patterns attaching the dummy bumps to respective ones of the dams.

According to further embodiments, a memory card includes a memory and a memory controller that controls operations of the memory. The memory or the memory controller includes a chip having a first surface on which main bumps are disposed and a second surface opposite to the first surface, a substrate having a surface on which connection pads connected to the main bumps are disposed, and fixing structures attached to the surface of the substrate along edges of a chip attachment region of the substrate.

According to further embodiments, a memory card includes a memory and a memory controller that controls operations of the memory. The memory or the memory controller includes a chip having a first surface on which main bumps are disposed and a second surface opposite to the first surface, a substrate having a surface on which connection pads are disposed, the connection pads being connected to the main bumps, dams disposed on the surface of the substrate and having top surfaces which are substantially coplanar with the second surface of chip, and an adhesive layer attached to outer sidewalls of the dams, the top surfaces of the dams, and the second surface of the chip.

BRIEF DESCRIPTION OF THE DRAWINGS

Embodiments of the present disclosure will become more apparent in view of the attached drawings and accompanying detailed description, in which.

DETAILED DESCRIPTION

Figure 1:
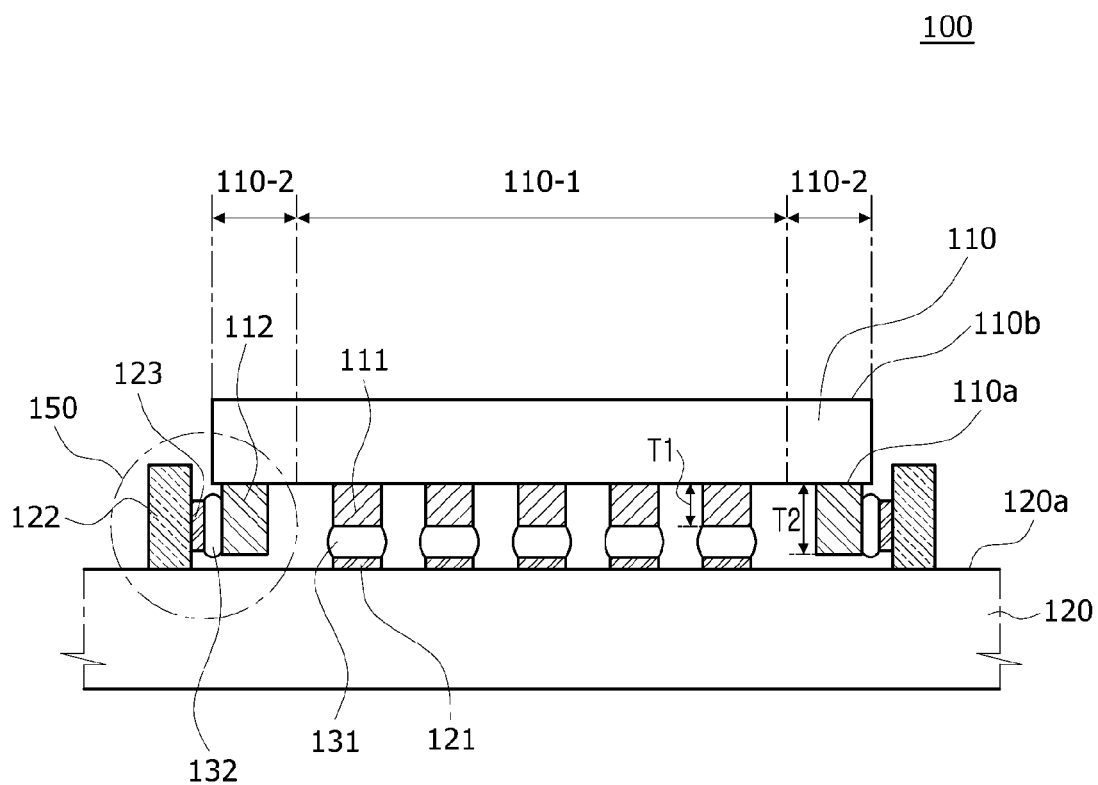
FIG. 1 is a cross-sectional view illustrating a flip chip package according to an embodiment of the present disclosure.

A flip chip packages includes a flip chip whose front surface faces a top surface of a substrate. In a flip chip package, the flip chip may be electrically connected to the top surface of the substrate through bumps disposed between the flip chip and the substrate. That is, bumps disposed on the front surface of the flip chip may be electrically connected to connection pads on the top surface of the substrate through conductive contact patterns, for example, solder patterns. After the flip chip is attached to the substrate using the aforementioned flip chip bonding technique, a subsequent process such as an underfill process, a mold process, and/or a reflow process is performed. On the other hand, during a subsequent process, a thermal stress or a mechanical stress may be applied to the flip chip causing warpage of the flip chip. As a result, edge portions of the flip chip may deflect away from the substrate. Accordingly, the warpage of the flip chip may lead to a connection failure between the flip chip and the substrate.

Embodiments may provide flip chip packages including various fixing structures to reduce the warpage of the flip chip packages when processes generating a thermal stress or a mechanical stress are performed. In an embodiment, dummy bumps may be employed to fix the edges of the flip chip. In an embodiment, fixing structures may prevent main bumps between the flip chip and the substrate from being damaged or deformed when a thermal stress or a mechanical stress is applied to the flip chip during a subsequent process.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being "on," "above," "below," or "under" another element, it can be directly "on," "above," "below," or "under" the other element, respectively, or intervening elements may also be present. Accordingly, the terms such as "on," "above," "below," or "under" which are used herein are for the purpose of describing particular embodiments.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion.

"Semiconductor chips" or "chips" of this disclosure may be obtained by separating a semiconductor substrate or a wafer where electronic circuits are integrated into a plurality of pieces using a die sawing process. The semiconductor chips may correspond to memory chips or logic chips. The memory chips may include dynamic random access memory (DRAM) circuits, static random access memory (SRAM) circuits, flash circuits, magneto-resistive random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The logic chips may include logic circuits, which are integrated with in the semiconductor substrate. In some cases, the term "semiconductor substrate" used herein may be construed as a semiconductor chip or a semiconductor die in which integrated circuits are formed.

Figure 2:
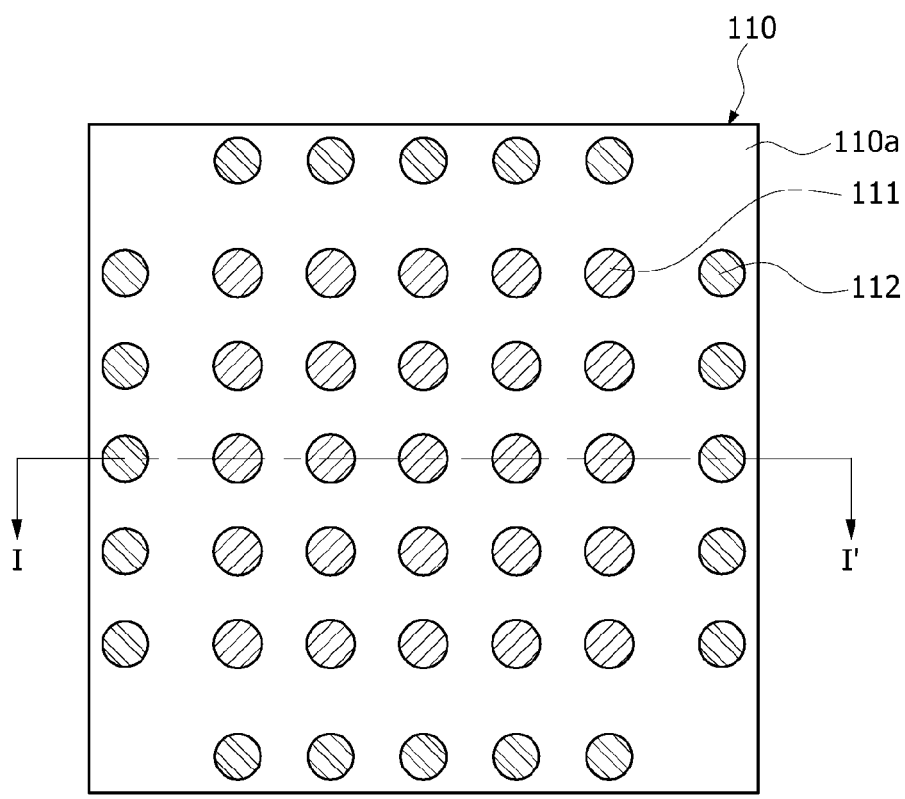
FIG. 2 is a plan view illustrating a flip chip employed in the flip chip package of FIG. 1.
Figure 2:
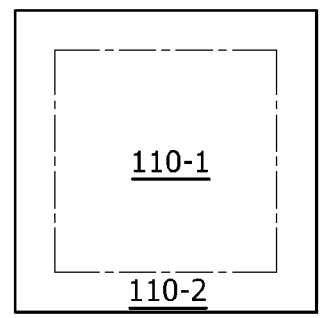
Figure 3:
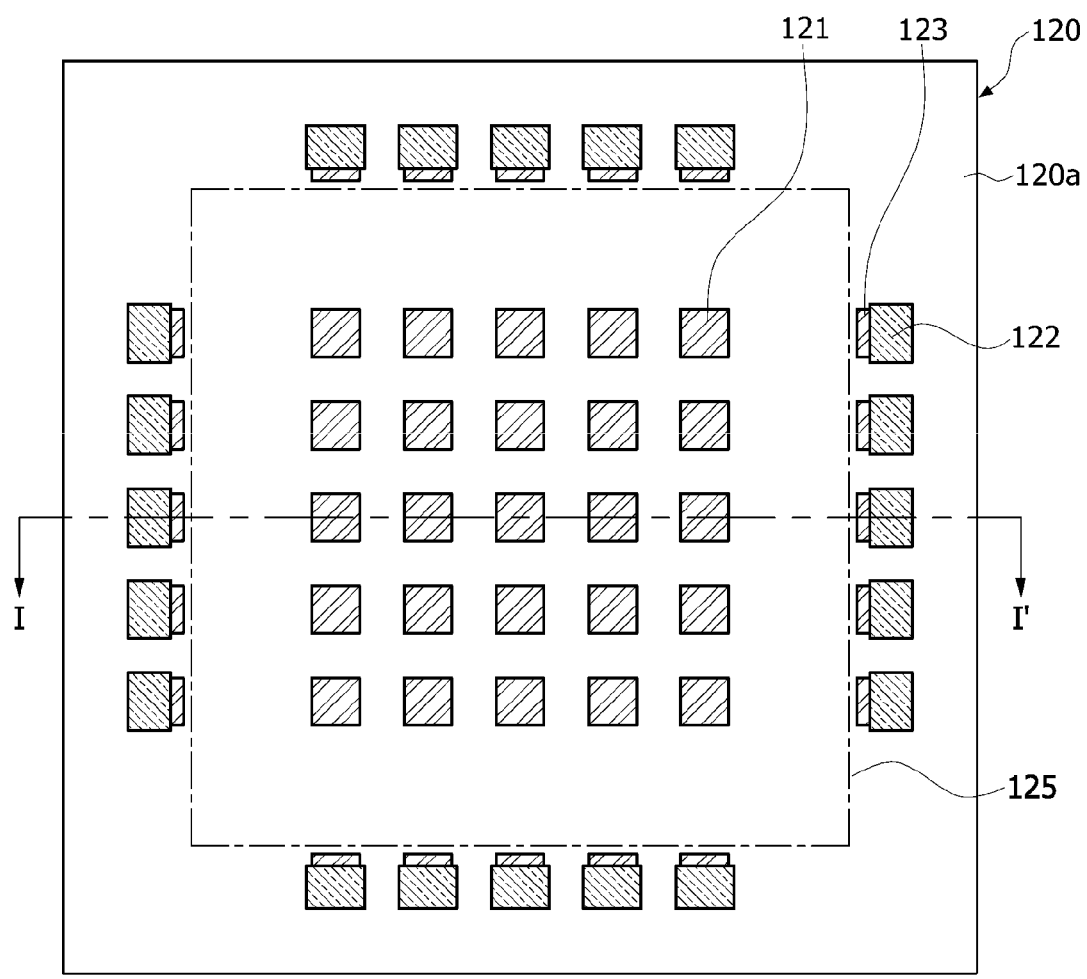
FIG. 3 is a plan view illustrating a substrate employed in the flip chip package of FIG. 1.

FIG. 1 is a cross-sectional view illustrating a flip chip package 100 according to an embodiment of the present disclosure. FIG. 2 is a plan view illustrating a flip chip 110 employed in the flip chip package 100 of FIG. 1, and FIG. 3 is a plan view illustrating a substrate 120 employed in the flip chip package 100 of FIG. 1. In FIGS. 1, 2, and 3, like reference numerals refer to like elements throughout. FIG. 1 is a cross-sectional view taken along a line I-I' of FIGS. 2 and 3.

Referring to FIGS. 1, 2 and 3, the flip chip package 100 may include a substrate 120 and a chip 110 disposed on a top surface 120a of the substrate 120 and have a flip chip bonding structure. The chip 110 may have a first surface 110a and a second surface 110b. The first surface 110a of the chip 110 may face the top surface 120a of the substrate 120, and the second surface 110b of the chip 110 may be a surface opposite to the first surface 110a of the chip 110. Main bumps 111 may be disposed on the first surface 110a of the chip 110, and the main bumps 111 may be electrically connected to connection pads 121 disposed on the top surface 120a of the substrate 120 through conductive contact patterns 131. Each of the conductive contact patterns 131 may include a solder material.

The first surface 110a of the chip 110 may be divided into a first region 110-1 and a second region 110-2, as illustrated in FIG. 2. The first region 110-1 may be a region on which the main bumps 111 are disposed, and the second region 110-2 may be a region surrounding the first region 110-1. That is, the first region 110-1 may correspond to an inner part of the first surface 110a of the chip 110, and the second region 110-2 may correspond to edge portions of the first surface 110a of the chip 110. The main bumps 111 may be arrayed in the first region 110-1.

The shape of the array and the number of the main bumps 111 may vary according to embodiments. In an embodiment, the main bumps 111 are arrayed in a matrix shape such that the main bumps 111 are separated from each other at a predetermined distance. In an embodiment, the main bumps 111 are arrayed in a circular shape in which the main bumps 111 are separated from each other by a predetermined distance. A shape of each of the main bumps 111 may vary according to embodiments. Each of the main bumps 111 may include a conductive material, for example, a metal material. The main bumps 111 may be electrically connected to electronic elements which are integrated in the chip 110.

Dummy bumps 112 may be arrayed in the second region 110-2 along edges of the chip 110 and may be spaced apart from each other. In some embodiments, the dummy bumps 112 may include the same material (e.g., a metal material) as the main bumps 111. Alternatively, the dummy bumps 112 may include a different material from the main bumps 111. The dummy bumps 112 may be electrically isolated from the electronic elements in the chip 110. Although not shown in the drawings, chip pads may be disposed between the chip 110 and the main bumps 111 as well as between the chip 110 and the dummy bumps 112.

The top surface 120a of the substrate 120 may have a chip attachment region 125 to which the chip 110 is attached, as illustrated in FIG. 3. The chip attachment region 125 of the substrate 120 corresponds to the first surface 110a of the chip 110. The connection pads 121 may be arrayed in the chip attachment region 125. The connection pads 121 may be arrayed to correspond to the main bumps 111, respectively. A plurality of dams 122 may be disposed along a periphery of the chip attachment region 125 of the substrate 120 and may be spaced apart from each other. The positions of the dams 122 may be determined according to the positions of the dummy bumps 112. In some embodiments, each of the dams 122 may include a solder resist material. As shown in FIG. 3, metal patterns 123 may be disposed on inner sidewalls of the dams 122 along the periphery of the chip attachment region 125 in order to attach the dummy bumps 112 to the dams 122. When the dams 122 include a solder resist material and the adhesive patterns 132 include a solder material, the metal patterns 123 may be disposed between the dams 122 and the adhesive patterns 132 to attach the dummy bumps 112 to the dams 122.

As seen in FIG. 1, the main bumps 111 may have a first thickness T1, and the dummy bumps 112 may have a second thickness T2 which is greater than the first thickness T1. The dummy bumps 112 may be spaced apart from the top surface 120a of the substrate 120. Outer sidewalls of the dummy bumps 112 facing the dams 122 may be attached to the inner sidewalls of the dams 122 using the adhesion patterns 132. If the adhesion patterns 132 include a solder material and the dams 122 are formed of a solder resist material, the outer sidewalls of the dummy bumps 112 may be adhered to the metal patterns 123 disposed on the inner sidewalls of the dams 122. Fixing structures 150 include the dummy bumps 112, the dams 122, the metal patterns 123, and the adhesion patterns 132. Since the dummy bumps 112 disposed along the edges of the chip 110 are adhered and fixed to the dams 122 disposed on the substrate 120, the fixing structures 150 may reduce the warpage of the chip 110 when a process generating a thermal stress or a mechanical stress is performed. In an embodiment, in order to improve adhesive strength between the adhesion pattern 132 and the dummy bump 112, the second thickness T2 of the dummy bump 112 is large such that the bottom surface of the dummy bump 112 is sufficiently close to the top surface 120a of the substrate 120. Such an embodiment increases the contact area between the dummy bump 112 and the adhesion pattern 132 to increase the adhesive strength between the dummy bump 112 and the adhesion pattern 132.

Figure 4:
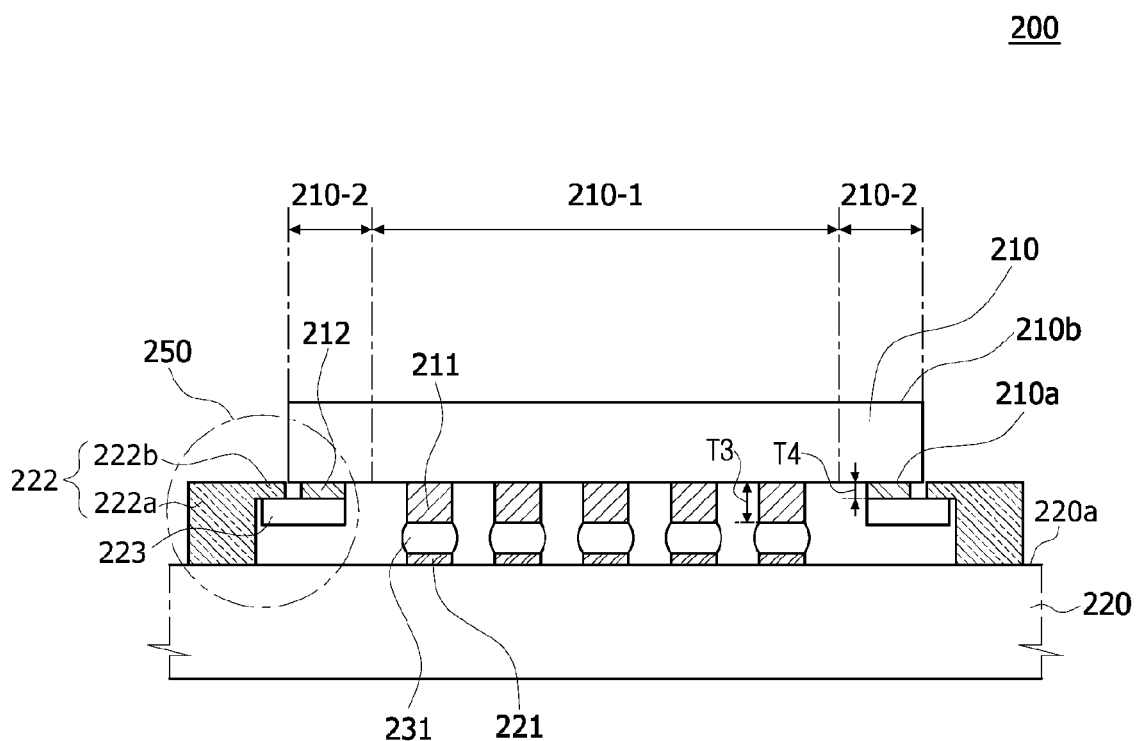
FIG. 4 is a cross-sectional view illustrating a flip chip package according to an embodiment of the present disclosure.
Figure 5:
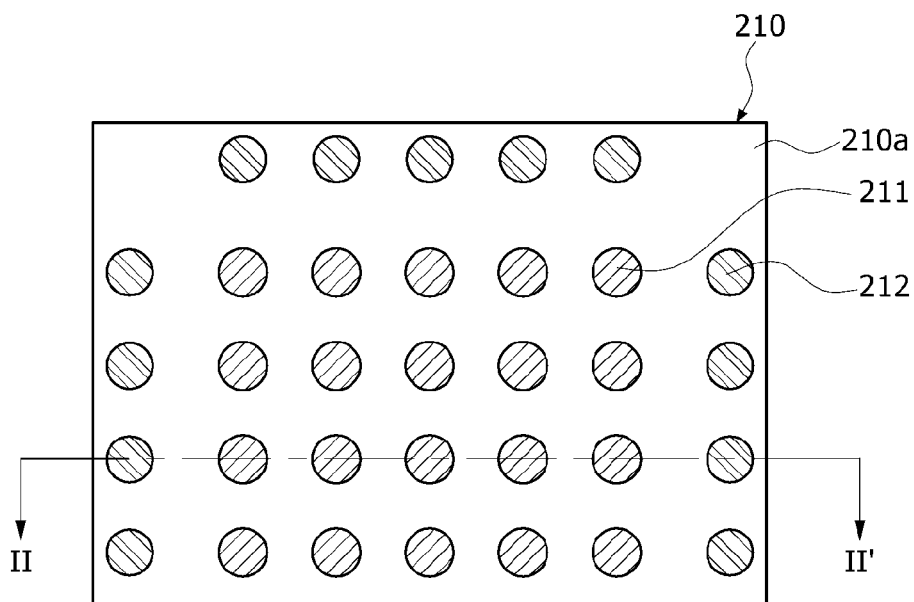
FIG. 5 is a plan view illustrating a flip chip employed in the flip chip package of FIG. 4.
Figure 5:
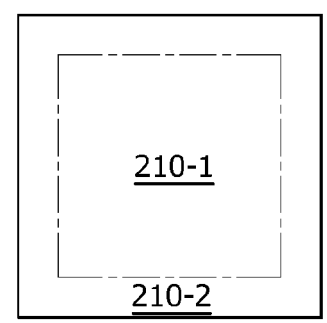
Figure 6:
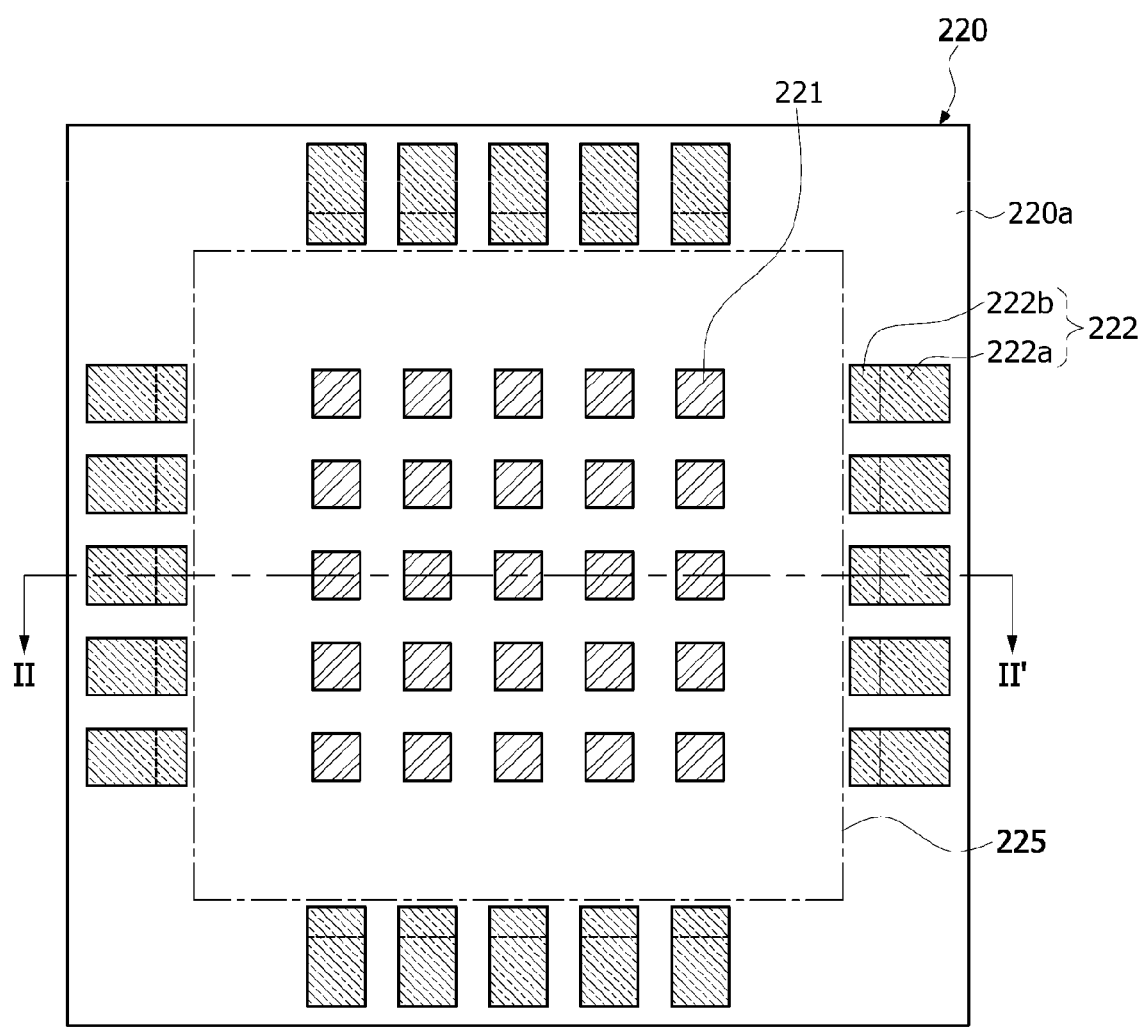
FIG. 6 is a plan view illustrating a substrate employed in the flip chip package of FIG. 4.

FIG. 4 is a cross-sectional view illustrating a flip chip package 200 according to an embodiment of the present disclosure. FIG. 5 is a plan view illustrating a flip chip 210 employed in the flip chip package 200 of FIG. 4, and FIG. 6 is a plan view illustrating a substrate 220 employed in the flip chip package 200 of FIG. 4. In FIGS. 4, 5 and 6, like reference numerals refer to like elements throughout. FIG. 4 is a cross-sectional view taken along a line II-II' of FIGS. 5 and 6.

Referring to FIGS. 4, 5 and 6, the flip chip package 200 may include a substrate 220 and a chip 210 disposed on a top surface 220a of the substrate 220 to have a flip chip bonding structure. The chip 210 may have a first surface 210a and a second surface 210b. The first surface 210a of the chip 210 may face the top surface 220a of the substrate 220, and the second surface 210b of the chip 210 may be a surface opposite to the first surface 210a of the chip 210. Main bumps 211 may be disposed on the first surface 210a of the chip 210, and the main bumps 211 may be electrically connected to connection pads 221 disposed on the top surface 220a of the substrate 220 through conductive contact patterns 231. Each of the conductive contact patterns 231 may include a solder material.

The first surface 210a of the chip 210 may be divided into a first region 210-1 and a second region 210-2, as illustrated in FIG. 5. The first region 210-1 may be a region on which the main bumps 211 are disposed, and the second region 210-2 may be a region surrounding the first region 210-1. That is, the first region 210-1 may correspond to an inner part of the first surface 210a of the chip 210, and the second region 210-2 may correspond to edge portions of the first surface 210a of the chip 210. The main bumps 211 may be arrayed in the first region 210-1. The array and the number of the main bumps 211 may vary according to embodiments. A shape of each of the main bumps 211 may also vary according to embodiments. Each of the main bumps 211 may include a conductive material, for example, a metal material. The main bumps 211 may be electrically connected to electronic elements which are integrated in the chip 210.

Dummy bumps 212 may be arrayed in the second region 210-2 along edges of the chip 210 and may be spaced apart from each other. In some embodiments, the dummy bumps 212 may include the same material (e.g., a metal material) as the main bumps 211. Alternatively, the dummy bumps 212 may include a different material from the main bumps 211. The dummy bumps 212 may be electrically isolated from the electronic elements in the chip 210. Although not shown in the drawings, chip pads may be disposed between the chip 210 and the main bumps 211 as well as between the chip 210 and the dummy bumps 212.

The top surface 220a of the substrate 220 may have a chip attachment region 225 to which the chip 210 is attached, as illustrated in FIG. 6. The connection pads 221 may be arrayed in the chip attachment region 225. The connection pads 221 may be arrayed to correspond to the main bumps 211, respectively.

A plurality of dams 222 may be disposed along a periphery of the chip attachment region 225 of the substrate 220 and may be spaced apart from each other. The positions of the dams 222 may be determined based on the positions of the dummy bumps 212. Each of the dams 222 may include a support portion 222a and a protruded portion 222b that protrudes from the support portion 222a. The support portion 222a of the dam 222 may be disposed on the top surface 220a of the substrate 220. The protruded portion 222b may be disposed to laterally protrude from a sidewall of the support portion 222a toward a sidewall of the chip 210. In some embodiments, each of the dams 222 may include a metal material.

As seen in FIG. 4, the main bumps 211 may have a first thickness T3, and the dummy bumps 212 may have a second thickness T4, which is less than the first thickness T3. An adhesion pattern 223 may be attached to bottom surfaces of the dummy bump 212 and the protruded portion 222b, which are adjacent to each other. In some embodiments, the adhesion pattern 223 may include a solder material. Fixing structures 250 include the dummy bumps 212, the dams 222, and the adhesion patterns. Since the dummy bumps 212 disposed along the edges of the chip 210 are adhered and fixed to the dams 222 disposed on the substrate 220, the fixing structures 250 may reduce the warpage of the chip 210 when a process generating a thermal stress or a mechanical stress is performed. In an embodiment, in order to improve adhesive strength between the adhesion pattern 223 and the bottom surfaces of the dummy bump 212 and the protruded portion 222b, the adhesion pattern 223 covers substantially all the bottom surfaces of the dummy bump 212 and the protruded portion 222b. In such an embodiment, since the contact area between the adhesion pattern 223 and the bottom surfaces of the dummy bump 212 and the protruded portion 222b are maximized, the adhesive strength in the contact area is increased.

Figure 7:
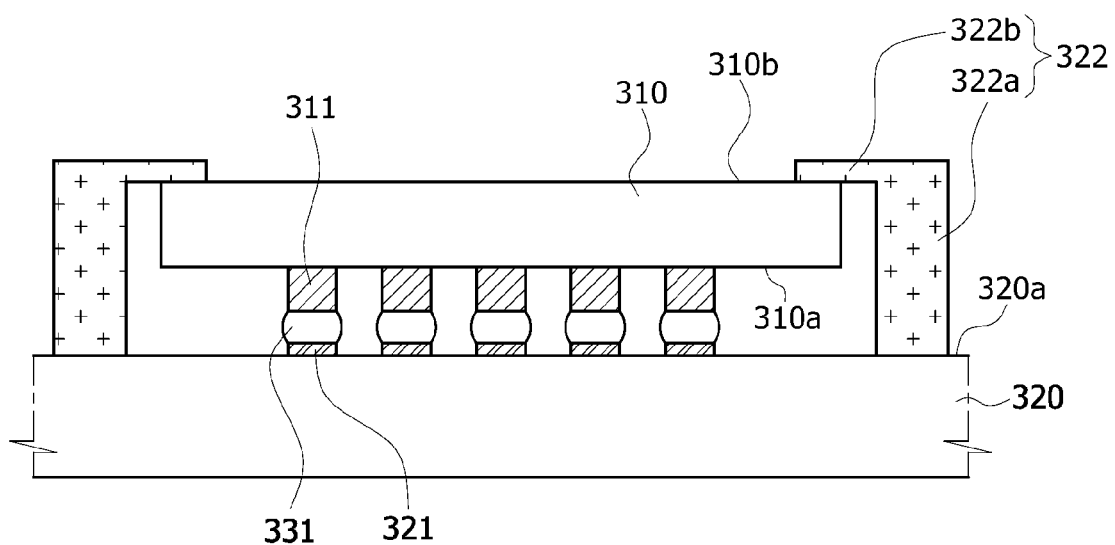
FIG. 7 is a cross-sectional view illustrating a flip chip package according to an embodiment of the present disclosure.
Figure 8:
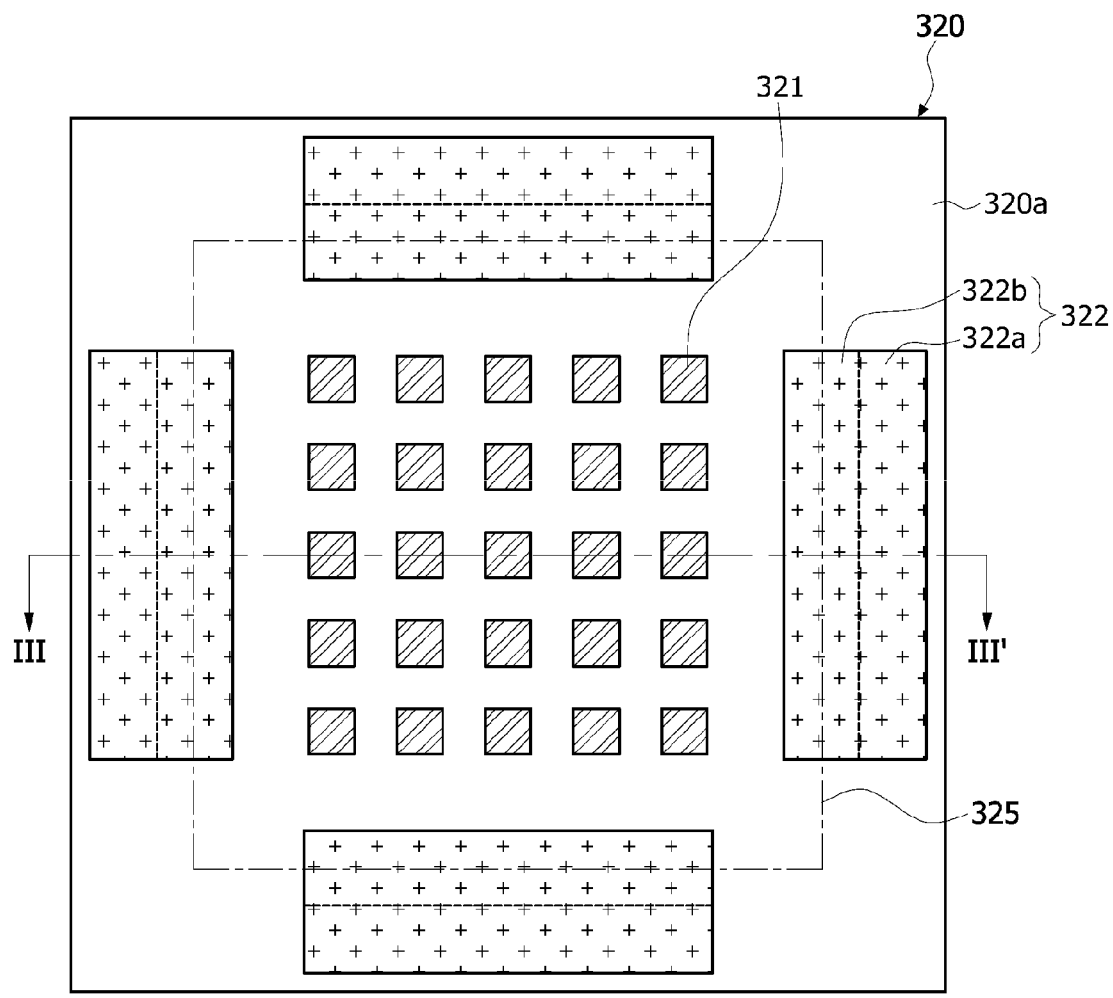
FIG. 8 is a plan view illustrating a substrate employed in the flip chip package of FIG. 7.

FIG. 7 is a cross-sectional view illustrating a flip chip package 300 according to an embodiment of the present disclosure, and FIG. 8 is a plan view illustrating a substrate 320 employed in the flip chip package 300 of FIG. 7. In FIGS. 7 and 8, like reference numerals refer to like elements throughout. FIG. 7 is a cross-sectional view taken along a line III-III' of FIG. 8.

Referring to FIGS. 7 and 8, the flip chip package 300 may include a substrate 320 and a chip 310 disposed on a top surface 320a of the substrate 320 to have a flip chip bonding structure. The chip 310 may have a first surface 310a and a second surface 310b. The first surface 310a of the chip 310 may face the top surface 320a of the substrate 320, and the second surface 310b of the chip 310 may be a surface opposite to the first surface 310a of the chip 310. Main bumps 311 may be disposed on the first surface 310a of the chip 310, and the main bumps 311 may be electrically connected to connection pads 321 disposed on the top surface 320a of the substrate 320 through conductive contact patterns 331. Each of the conductive contact patterns 331 may include a solder material.

The top surface 320a of the substrate 320 may have a chip attachment region 325 to which the chip 310 is attached, as illustrated in FIG. 8. The connection pads 321 may be arrayed in the chip attachment region 325. The connection pads 321 may be arrayed to correspond to the main bumps 311, respectively. A fixing structure 322 may include a support portion 322a and a protruded portion 322b that protrudes from the support portion 322a. Four support portions 322a may be disposed on the top surface 320a of the substrate 320 along four edges of the chip attachment region 325, respectively. Inner sidewalls of the support portions 322a may be spaced apart from corresponding sidewalls of the chip 310, as illustrated in FIG. 7. The protruded portion 322b may laterally protrude from an upper portion of a sidewall of the corresponding support portion 322a such that a portion of the bottom surface of the protruded portion 322b overlaps with an edge portion of the second surface 310b of the chip 310. That is, the bottom surface of the protruded portion 322b may be attached to the edge portion of the second surface 310b of the chip 310.

In an embodiment, the support portion 322a and the protruded portion 322b include different materials from each other. Since the fixing structures 322 are adhered and fixed to the edge portions of the chip 310, the fixing structures 322 may reduce the warpage of the chip 310 when a process generating a thermal stress or a mechanical stress is performed. In some embodiments, each of the fixing structures 322 may include a solder resist material. Although FIGS. 7 and 8 illustrate an embodiment in which the four support portions 322b of the four fixing structures 322 are respectively disposed adjacent to four side surfaces of the chip 310, the number of the fixing structures 322 may vary according to the embodiments. For example, in some embodiments, only two support portions 322b of two fixing structures 322 may be disposed adjacent to two opposing side surfaces of the chip 310, respectively.

Figure 9:
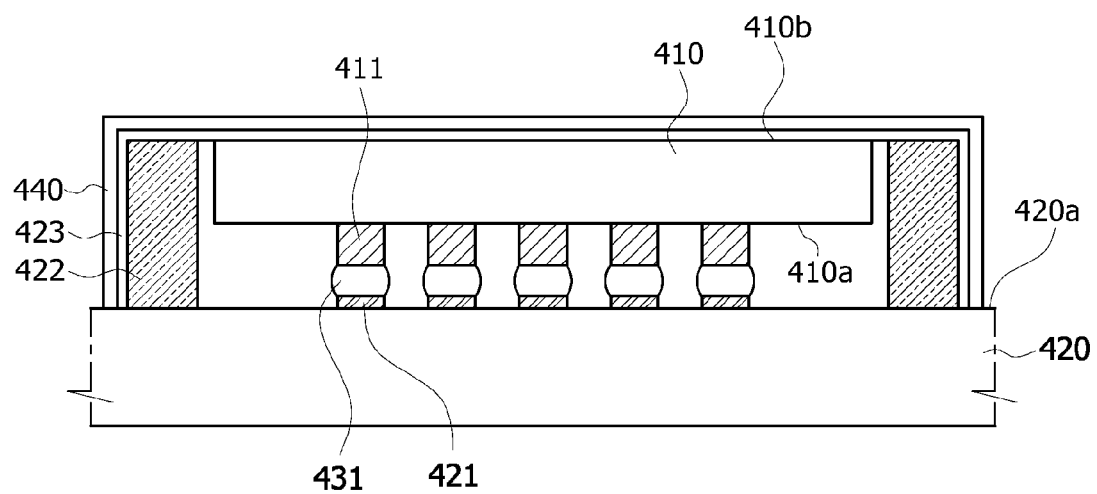
FIG. 9 is a cross-sectional view illustrating a flip chip package according to an embodiment of the present disclosure.
Figure 10:
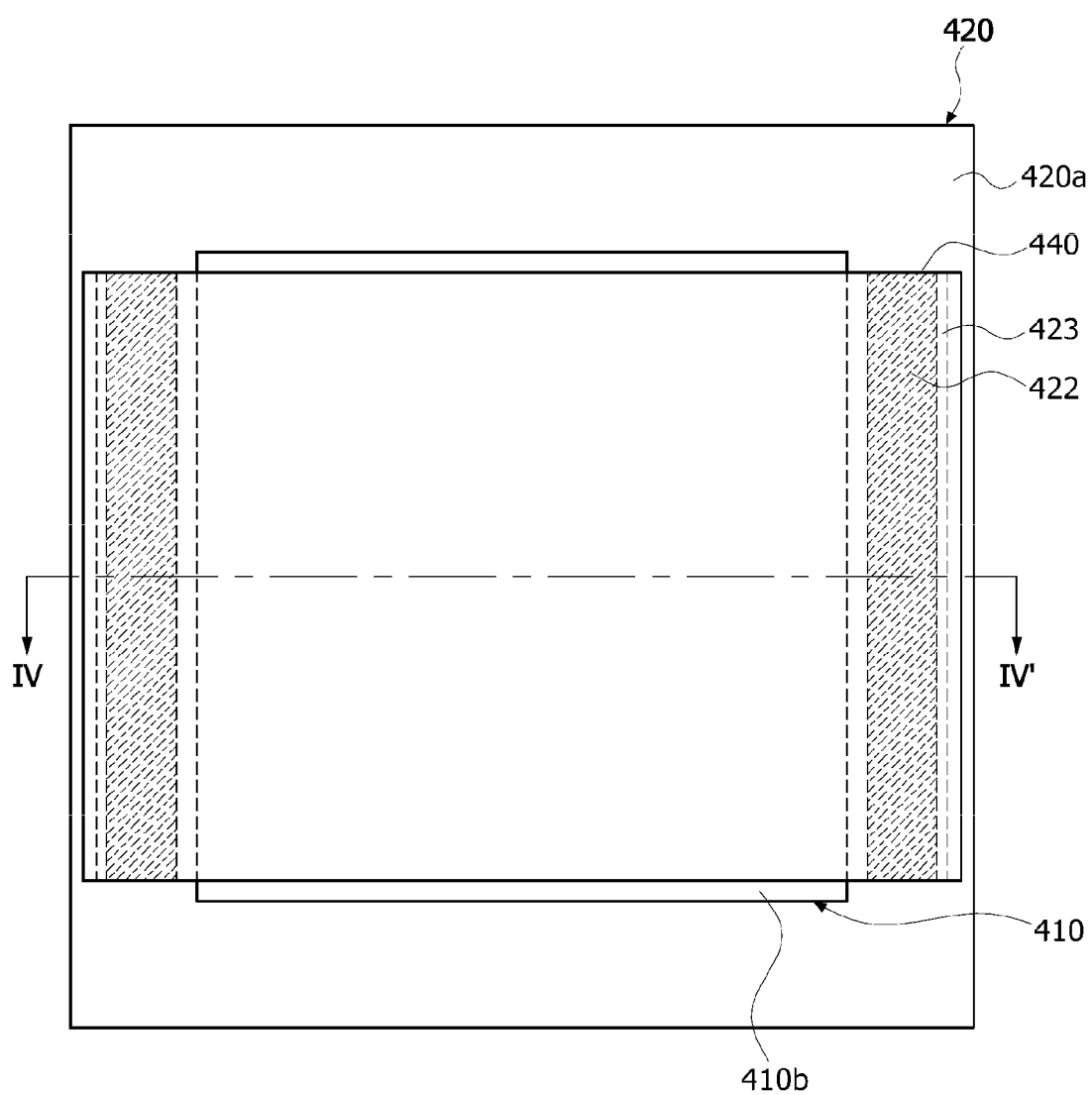
FIG. 10 is a plan view of the flip chip package shown in FIG. 9.

FIG. 9 is a cross-sectional view illustrating a flip chip package 400 according to an embodiment of the present disclosure, and FIG. 10 is a plan view of the flip chip package 400 shown in FIG. 9. In FIGS. 9 and 10, like reference numerals refer to like elements throughout. FIG. 9 is a cross-sectional view taken along a line IV-IV' of FIG. 10.

Referring to FIGS. 9 and 10, the flip chip package 400 may include a substrate 420 and a chip 410 disposed on a top surface 420a of the substrate 420 to have a flip chip bonding structure. The chip 410 may have a first surface 410a and a second surface 410b. The first surface 410a of the chip 410 may face the top surface 420a of the substrate 420, and the second surface 410b of the chip 410 may be a surface opposite to the first surface 410a of the chip 410. Main bumps 411 may be disposed on the first surface 410a of the chip 410, and the main bumps 411 may be electrically connected to connection pads 421 disposed on the top surface 420a of the substrate 420 through conductive contact patterns 431. Each of the conductive contact patterns 431 may include a solder material.

A pair of dams 422 may be disposed on the top surface 420a of the substrate 420. The pair of dams 422 may be respectively disposed at two opposing sides of the chip 410 and may extend along two opposing sidewalls of the chip 410. The pair of dams 422 may be spaced apart from the two opposing sidewalls of the chip 410. In some embodiments, each of the dams 422 may include a solder resist material. Top surfaces of the dams 422 may be substantially coplanar with the second surface 410b of the chip 410. An adhesive layer 440 may be disposed on outer sidewalls and top surfaces of the dams 422 and the second surface 410b of the chip 410. In some embodiments, the adhesive layer 440 may be a conductive tape.

Since the adhesive layer 440 fixes the chip 410 to the substrate 420, the adhesive layer 440 may reduce the warpage of the chip 410 when a process generating a thermal stress or a mechanical stress is performed. In an embodiment, an additional adhesive layer 423 may be disposed between the adhesive layer 440 and the dams 422 in order to further increase a fixing strength by which the chip 410 is attached to the dams 422. In an embodiment, the adhesive layer 440 is a conductive tape electrically connected to a ground interconnection line of the substrate 420, so that the adhesive layer 440 may act as an electromagnetic interference (EMI) shielding layer.

The flip chip packages described above may be applied to various electronic systems.

Figure 11:
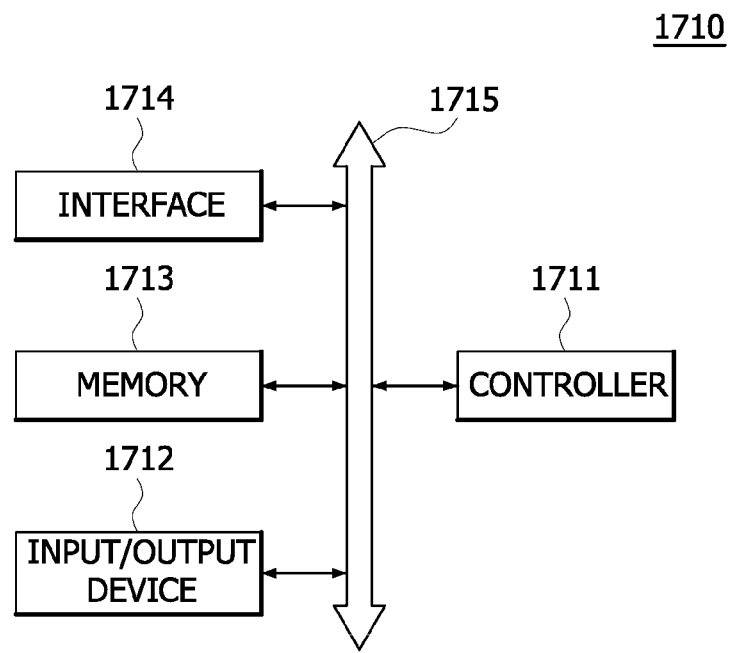
FIG. 11 is a block diagram illustrating an electronic system including at least one of flip chip packages according to embodiments of the present disclosure.

Referring to FIG. 11, a flip chip package in accordance with an embodiment may be employed in an electronic system 1710. The electronic system 1710 may include a controller 1711, an input/output device 1712, and a memory 1713. The controller 1711, the input/output device 1712 and the memory 1713 may be coupled with one another through a bus 1715 providing a path through which data are transmitted.

For example, the controller 1711 may include at least any one of one or more microprocessor, one or more digital signal processor, one or more microcontroller, and logic devices capable of performing substantially the same functions as these components. At least one of the controller 1711 and the memory 1713 may include at least any one of flip chip packages according to embodiments of the present disclosure. The input/output device 1712 may include at least one selected among a keypad, a keyboard, a display device, a touch screen, and so forth. The memory 1713 is a device for storing data. The memory 1713 may store data and/or commands to be executed by the controller 1711, and the likes.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 1710 may stably store a large amount of data in a flash memory system.

The electronic system 1710 may further include an interface 1714 configured to transmit and receive data to and from a communication network. The interface 1714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment wherein the electronic system 1710 is an equipment capable of performing wireless communication, the electronic system 1710 may be used in a communication system such as of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 12:
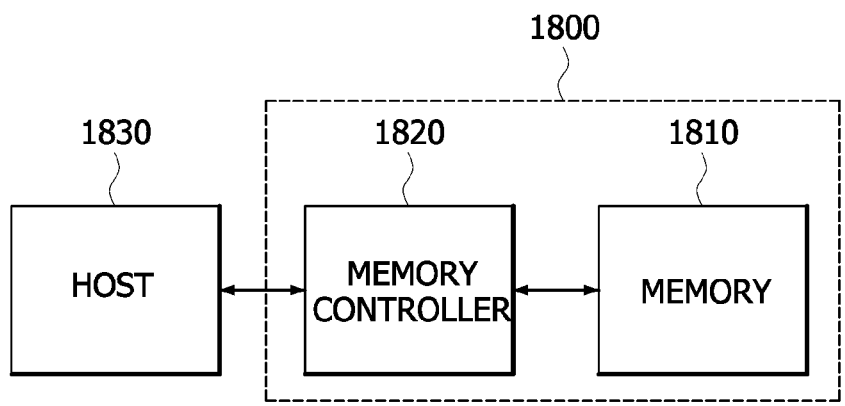
FIG. 12 is a block diagram illustrating an electronic system including at least one of flip chip packages according to embodiments of the present disclosure.

Referring to FIG. 12, a flip chip package in accordance with an embodiment may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include one or more nonvolatile memory device to which the packaging technologies according to embodiments of the present disclosure are applied. The memory controller 1820 may control the memory 1810 such that stored data is read out or data is stored in response to a read/write request from a host 1830.

Embodiments have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A flip chip package comprising:
a chip;
main bumps disposed on a first region of a surface of the chip;
dummy bumps disposed on a second region of the surface of the chip;
a substrate;
dams disposed on a surface of the substrate;
connection pads disposed on the surface of the substrate and electrically connected to respective ones of the main bumps; and
adhesion patterns attaching the dummy bumps to respective ones of the dams.

2. The flip chip package of claim 1, wherein the first region corresponds to an inner portion of the surface of the chip, and wherein the second region corresponds to edge portions of the surface of the chip that surround the first region.

3. The flip chip package of claim 1, wherein the dummy bumps are disposed along edges of the surface of the chip and are spaced apart from each other.

4. The flip chip package of claim 3, wherein the dams are disposed along a periphery of a chip attachment region of the substrate and are spaced apart from each other.

5. The flip chip package of claim 1, wherein a thickness of the dummy bumps is greater than a thickness of the main bumps.

6. The flip chip package of claim 5, wherein the adhesion patterns attach outer sidewalls of the dummy bumps to inner sidewalls of respective dams.

7. The flip chip package of claim 6, wherein each of the adhesion patterns includes a solder material.

8. The flip chip package of claim 7, wherein each of the dams includes a solder resist material.

9. The flip chip package of claim 8, further comprising metal patterns disposed between the dams and respective ones of the adhesion patterns.

10. The flip chip package of claim 1, wherein a thickness of the dummy bumps is less than a thickness of the main bumps.

11. The flip chip package of claim 10, wherein each dam of the dams includes:
a support portion disposed on the surface of the substrate; and
a protruded portion protruding from an inner sidewall of the support portion toward a dummy bump adjacent to the support portion.

12. The flip chip package of claim 11, wherein an adhesion pattern of the adhesion patterns is attached to a bottom surface of the dummy bump and a bottom surface of the protruded portion of the dam, the dummy bump and the protruded portion being adjacent to each other.

13. The flip chip package of claim 12, wherein each of the adhesion patterns includes a solder material.

14. The flip chip package of claim 13, wherein each of the dams includes a metal material.

15. A flip chip package comprising:
a chip having a first surface on which main bumps are disposed and a second surface opposite to the first surface;
a substrate having a surface on which connection pads are disposed, the connection pads being connected to the main bumps;

dams disposed on the surface of the substrate and having top surfaces which are substantially coplanar with the second surface of the chip; and an adhesive layer attached to outer sidewalls of the dams, the top surfaces of the dams, and the second surface of the chip, wherein the adhesive layer includes a conductive tape.

16. The flip chip package of claim 15, wherein each of the dams includes a solder resist material.

17. The flip chip package of claim 15, wherein the dams includes a pair of dams, wherein the pair of dams are respectively disposed at two opposing sides of the chip, and wherein the pair of dams extend along two opposing sidewalls of the chip and are spaced apart from the two opposing sidewalls of the chip, respectively.

\* \* \* \* \*